(12) United States Patent
Horibe

(10) Patent No.: US 9,050,633 B2
(45) Date of Patent: Jun. 9, 2015

(54) TEMPLATE WASHING METHOD, PATTERN FORMING METHOD, PHOTOWASHING APPARATUS, AND NANOIMPRINT APPARATUS

(71) Applicant: USHIO DENKI KABUSHIKI KAISHA, Tokyo-to (JP)

(72) Inventor: Hiroki Horibe, Hyogo-ken (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/903,764

(22) Filed: May 28, 2013

(65) Prior Publication Data

US 2013/0323431 A1    Dec. 5, 2013

(30) Foreign Application Priority Data

Jun. 4, 2012    (JP) ................................. 2012-126683

(51) Int. Cl.
| | |
|---|---|
| *B08B 3/00* | (2006.01) |
| *B08B 7/00* | (2006.01) |
| *B08B 7/04* | (2006.01) |
| *G03F 7/00* | (2006.01) |

(52) U.S. Cl.
CPC ................. *B08B 7/0057* (2013.01); *B08B 7/04* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 3,735,558 A * | 5/1973 | Skarstrom et al. ................ | 95/51 |
| 2008/0090170 A1 | 4/2008 | Yoneda | |
| 2010/0044921 A1 | 2/2010 | Ito | |

FOREIGN PATENT DOCUMENTS

| | | |
|---|---|---|
| JP | 08-236492 A | 9/1996 |
| JP | 2000-194142 A | 7/2000 |
| JP | 2008-091782 A | 4/2008 |
| JP | 2010-046923 A | 3/2010 |

OTHER PUBLICATIONS

JPO machine translation of JP 08236492 retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=H08-236492 on Sep. 21, 2014.*

* cited by examiner

*Primary Examiner* — Eric Golightly
(74) *Attorney, Agent, or Firm* — Studebaker & Brackett PC

(57) ABSTRACT

A template washing method and a photowashing apparatus which ensure removal of resist residual remaining on a pattern surface of a template, a pattern forming method and a nanoimprint apparatus which ensure formation of patterns with fewer defects are provided. The template washing method of the invention for photowashing the pattern surface of the template used in nanoimprint includes a vacuum-ultraviolet light irradiation process for irradiating the pattern surface of the template with vacuum ultraviolet light under an atmosphere of dry air.

8 Claims, 6 Drawing Sheets

TEMPLATE WASHING METHOD, PATTERN FORMING METHOD, PHOTOWASHING APPARATUS, AND NANOIMPRINT APPARATUS

BACKGROUND OF THE INVENTION

1. Technical Field

The present invention relates to a template washing method for photowashing a template used for nanoimprint, a pattern forming method using a template washed by the template washing method, a photowashing apparatus used for the template washing method, and a nanoimprint apparatus provided with the photowashing apparatus.

2. Description of the Related Art

In recent years, in manufacture of semiconductor chips and biochips, a nanoimprint technology draws attention as a method capable of achieving the manufacture at lower costs in comparison with a pattern forming method using photolithography and etching of the related art.

In the pattern forming method using the nanoimprint technology, processes of forming a nanoimprint material layer on a substrate on which a pattern is to be formed, for example, on a wafer by applying a nanoimprint material including liquid-state resist of a light-cured type or a thermoset type, bringing a template (mold) formed with a pattern which is a negative pattern of the pattern to be formed into contact with the nanoimprint material layer and, in this state, performing a curing process on the nanoimprint material layer, and then separating the template from the obtained cured resin layer are performed (see JP-A-2000-194142 and JP-A-2008-91782).

In such a pattern forming method, when a resist residual exists on a surface of the template, a pattern obtained may have a defect, so that the surface of the template needs to be washed.

Therefore, as a method of washing the template, a method of immersing a pattern surface of the template into a cleaning agent such as water, then irradiating the pattern surface of the template with ultraviolet light to generate radicals such as oxygen radical or OH radical by photoexciting the cleaning agent, and degrading and removing the resist residual by the radicals (see JP-A-2010-46923) is known.

Therefore, in such a washing method, there is a problem that when the pattern surface of the template is immersed in the cleaning agent, the resist residual is dispersed in the cleaning agent, and hence a secondary contamination occurs by adhesion of the resist residual dispersed in the cleaning agent again to the template during the following template washing.

Also, there is a problem that production efficiency is lowered because the washing of the template needs to work to remove the template from a nanoimprint apparatus, and then mount the template on the nanoimprint apparatus after the washing of the template is ended, and hence a pattern forming process must be stopped for a long time.

In contrast, in a process of manufacturing the liquid crystal display device or the like, a photowashing method is used as means for washing a glass substrate (see JP-A-8-236492).

In the photowashing method, a surface of the glass substrate is irradiated with vacuum ultraviolet light and hence foreign substances are degraded by energy of the vacuum ultraviolet light, and the degraded substances are oxidized and gasified by active oxygen such as radical oxygen, or ozone generated by irradiation of oxygen in the air with the vacuum ultraviolet light, and consequently, the foreign substances existing on the surface of the glass substrate are removed.

However, it was found that resist residual can hardly be removed reliably when the photowashing method used in the process of manufacturing the liquid crystal display device or the like is applied for washing the template.

After a great deal of diligent consideration on such problems, the inventor estimated that sulfuric acid, phosphoric acid, and other sulfur compound, or phosphorous compound were generated by the reaction of elemental sulfur or elemental phosphorus contained in the resist residual with water in the air, and the sulfur compound and the phosphorous compound stayed on the pattern surface of the template, and reached the invention on the basis of this knowledge.

SUMMARY

It is an object of the invention to provide a template washing method and a photowashing apparatus which are capable of removing resist residual remained on a pattern surface of a template.

It is another object of the invention to provide a pattern forming method and a nanoimprint apparatus capable of forming a pattern having fewer defects.

A template washing method of the invention for photowashing a pattern surface of a template used in nanoimprint includes a vacuum-ultraviolet light irradiation process for irradiating the pattern surface of the template with vacuum ultraviolet light under an atmosphere of dry air.

Preferably, a dew point of the dry air falls within a range from −110 to 10° C., and more preferably, a range from −90 to −30° C. in the template washing method of the invention. Here, the dew point of the dry air in this specification is assumed to be a dew point at a temperature of 25° C. before being introduced in the apparatus. The reason is that since there are few temperature variations because the nanoimprint process is performed in a clean room, the temperature of inline air may be controlled at the dew point of 25° C.

Preferably, the vacuum-ultraviolet light irradiation process is performed in a state in which a temperature of the pattern surface of the template is controlled to fall within a range from 25 to 150° C. in the template washing method of the invention.

The temperature of the template may be controlled by a temperature control device arranged in contact with or in proximity to the template, or the temperature of the template may be controlled by setting the temperature of the dry air to fall within the range from 25 to 150° C. in this template washing method.

As dew point measuring instruments for dry air of the invention, a 6740-type pressure dew point converter manufactured by Testo AG was used for a temperature up to −80° C., and a nano trace moisture meter DF750 type manufactured by GE Panametrics for low moisture below −80° C. With the latter instrument, the water content is measured from ppm to ppt, but the dew point may be obtained by calculation.

A pattern forming method of the invention includes forming an imprint material layer by applying an imprint material on a substrate on which a pattern is to be formed; and pressing the template washed by the template washing method described above against the imprint material layer and, in this state, hardening the imprint material layer.

In the pattern forming method of the invention, the imprint material may include a substance containing elemental sulfur and/or elemental phosphorus.

A photowashing apparatus of the invention includes a light output mechanism including a housing having an ultraviolet light transmitting window and an ultraviolet light emitting lamp arranged in the housing and configured to emit vacuum ultraviolet light, the ultraviolet light transmitting window of the light output mechanism being arranged so as to face a pattern surface of a template in a nanoimprint apparatus via a clearance, and a dry air supply port to be connected to a dry air supply mechanism is provided in the periphery of the ultraviolet light transmitting window.

Preferably, the photowashing apparatus of the invention includes a dry air suction port configured to suck dry air flowing through the clearance between the ultraviolet light transmitting window and the template in the periphery of the ultraviolet light transmitting window.

A nanoimprint apparatus of the invention has a template arranged in a chamber, a conveyance mechanism formed with an imprint material layer formed on a substrate and configured to convey an object to be processed at a position below the template, and a hardening device configured to harden the imprint material layer, and includes: a photowashing apparatus including a housing having an ultraviolet light transmitting window and an ultraviolet light emitting lamp arranged in the housing and configured to emit vacuum ultraviolet light, the ultraviolet light transmitting window being arranged so as to face a pattern surface of a template via a clearance, and the chamber is formed with a dry air supply port to be connected to a dry air supply mechanism.

A nanoimprint apparatus of the invention includes a template arranged in a chamber, a conveyance mechanism formed with an imprint material layer formed on a substrate and configured to convey an object to be processed at a position below the template, and a hardening device configured to harden the imprint material layer, and the photowashing apparatus described above is provided.

According to the template washing method and the photowashing apparatus of the invention, even when the imprint material contains elemental sulfur or elemental phosphorus, generation of the sulfur compound such as sulfuring acid or phosphorous compound such as phosphoric acid is prevented or suppressed by irradiating the pattern surface of the template with the vacuum ultraviolet light under the atmosphere of the dry air, so that the resist residual remaining on the pattern surface of the template may be removed.

Also, according to the pattern forming method or the nanoimprint apparatus of the invention, a pattern having fewer defects may be reliably formed by pressing the template washed by the above-described template washing method against the imprint material layer.

DESCRIPTION OF THE PREFERRED EMBODIMENTS

Hereinafter, an embodiment of the invention will be described in detail.

Figure 1A:
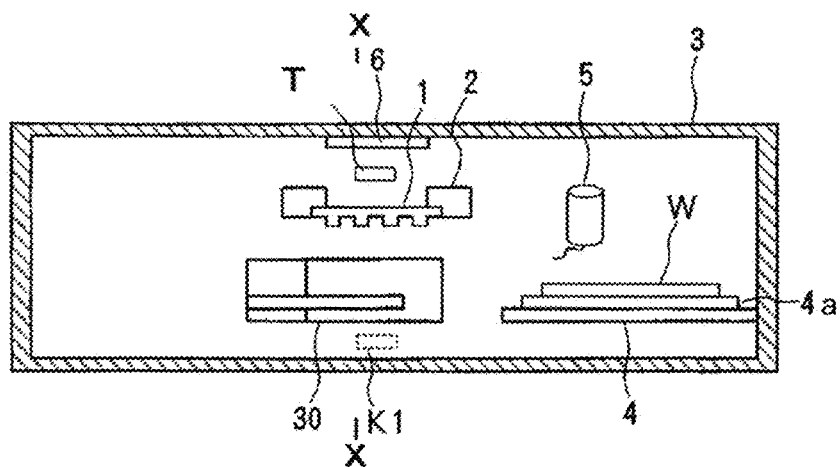
FIG. 1A is an explanatory drawing illustrating a rough configuration of an interior of an exemplified nanoimprint apparatus for executing a template washing method and a pattern forming method of the invention.
Figure 1B:
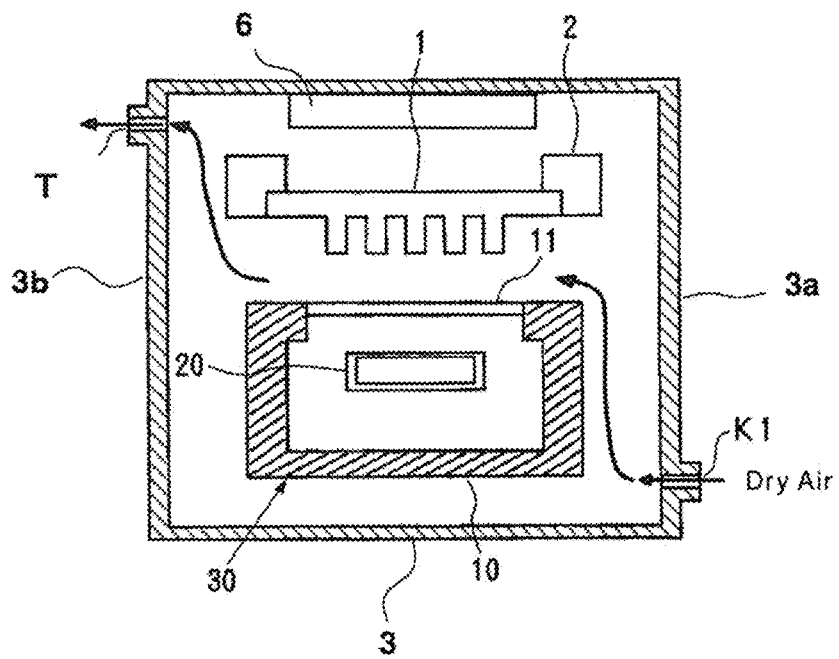
FIG. 1B is an explanatory cross-sectional view of the nanoimprint apparatus illustrated in FIG. 1A taken along a line X-X.

FIG. 1A is an explanatory view illustrating a rough configuration of an interior of an exemplified nanoimprint apparatus for executing a template washing method and a pattern forming method of the invention; and FIG. 1B is an explanatory cross-sectional view illustrating the nanoimprint apparatus in FIG. 1A taken along a line X-X.

In FIG. 1, reference numeral 1 denotes a template, reference numeral 2 denotes a holding member configured to hold the template 1, reference numeral 3 denotes a chamber, and the template 1 is positioned in an interior of the chamber 3. Reference numeral 4 denotes a conveyance mechanism configured to convey a substrate W as an object to be processed to a position below the template 1, and a chuck 4a configured to hold the substrate W is provided in the conveyance mechanism 4. Reference numeral 5 denotes an application device on the basis of an ink jet system configured to form an imprint material layer by applying an imprint material formed of liquid-state light-cured resist on a surface of the substrate W, and reference numeral 6 denotes a hardening device positioned above the template 1 and configured to perform a process of hardening the imprint material layer by irradiating the imprinting material layer formed on the substrate W with ultraviolet light via the template. Reference numeral 30 denotes a photowashing apparatus configured to irradiate a pattern surface of the template 1 with vacuum ultraviolet light, and the photowashing apparatus 30 is fixed to a conveyance arm (not illustrated) configured to convey the photowashing apparatus 30 so as to be arranged on the pattern surface of the template 1 via a clearance.

A dry air supply port K1 connected to a dry air supply mechanism (not illustrated) configured to supply dry air between the substrate W and the photowashing apparatus is formed at a position below one side wall 3a of the chamber 3, and a dry air exit port T for draining dried air from the dry air supply port K1 is formed at a position above an other side wall 3b facing the one side wall 3a of the chamber 3.

In addition, a dew point measuring instrument (not illustrated) configured to measure a dew point of the air in the chamber 3 is provided in the chamber 3.

Examples of materials that configure the template 1 include a material that allows transmission of the ultraviolet light from the hardening device 6, for example, synthetic quartz glass is preferably used.

As an ultraviolet light source in the hardening device 6, for example, a metal halide lamp, a high-pressure mercury lamp, or an LED may be used.

Figure 2:
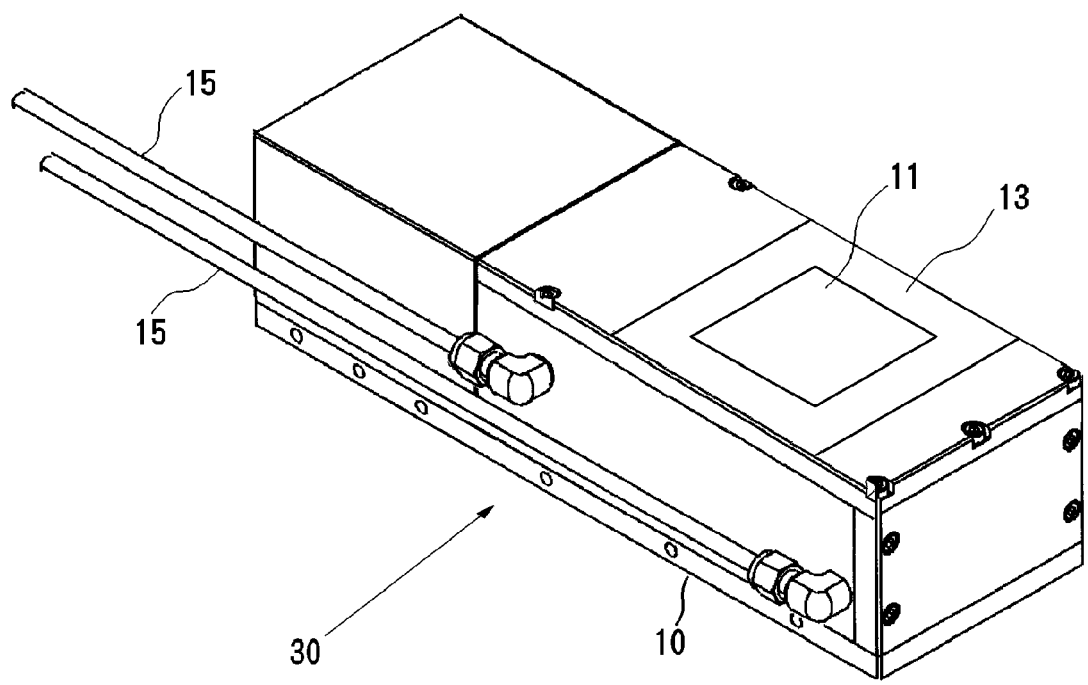
FIG. 2 is an explanatory perspective view illustrating a configuration of an exemplified photowashing apparatus used in the template washing method of the invention.
Figure 3:
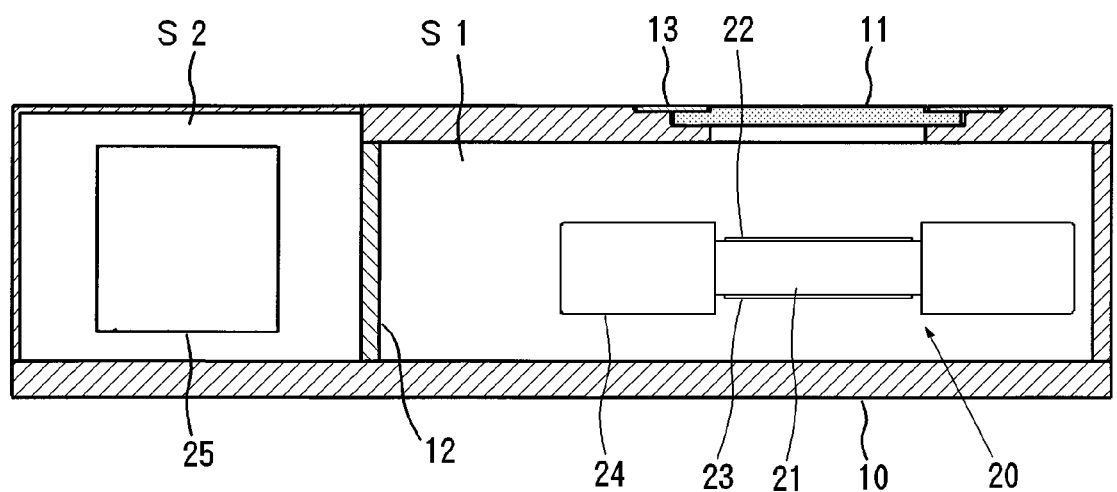
FIG. 3 is an explanatory cross-sectional view of the photowashing apparatus illustrated in FIG. 2.

FIG. 2 is an explanatory perspective view illustrating a configuration of an appearance of an exemplified photowashing apparatus 30, and FIG. 3 is an explanatory cross-sectional view illustrating a configuration of an interior of the photowashing apparatus in FIG. 2.

A housing 10 in the photowashing apparatus 30 has an outline of substantially parallelepiped and a lamp storage chamber S1 and a circuit chamber S2 are formed in the housing 10 so as to be arranged side by side via a diaphragm 12, and an ultraviolet light transmitting window 11 formed of quartz glass, for example, is provided on an upper surface of the housing 10 at a portion where the lamp storage chamber S1 is formed by being fixed by a frame-shaped fixed plate 13.

An excimer lamp 20 configured to radiate vacuum ultraviolet light having wavelengths of 200 nm or shorter is arranged in the lamp storage chamber S1 of the housing 10, and a booster transformer 25 is arranged in the circuit chamber S2. In FIG. 2, reference numeral 15 denotes a purge gas circulating pipe configured to supply purge gas such as nitrogen gas into the lamp storage chamber S1.

Figure 4:
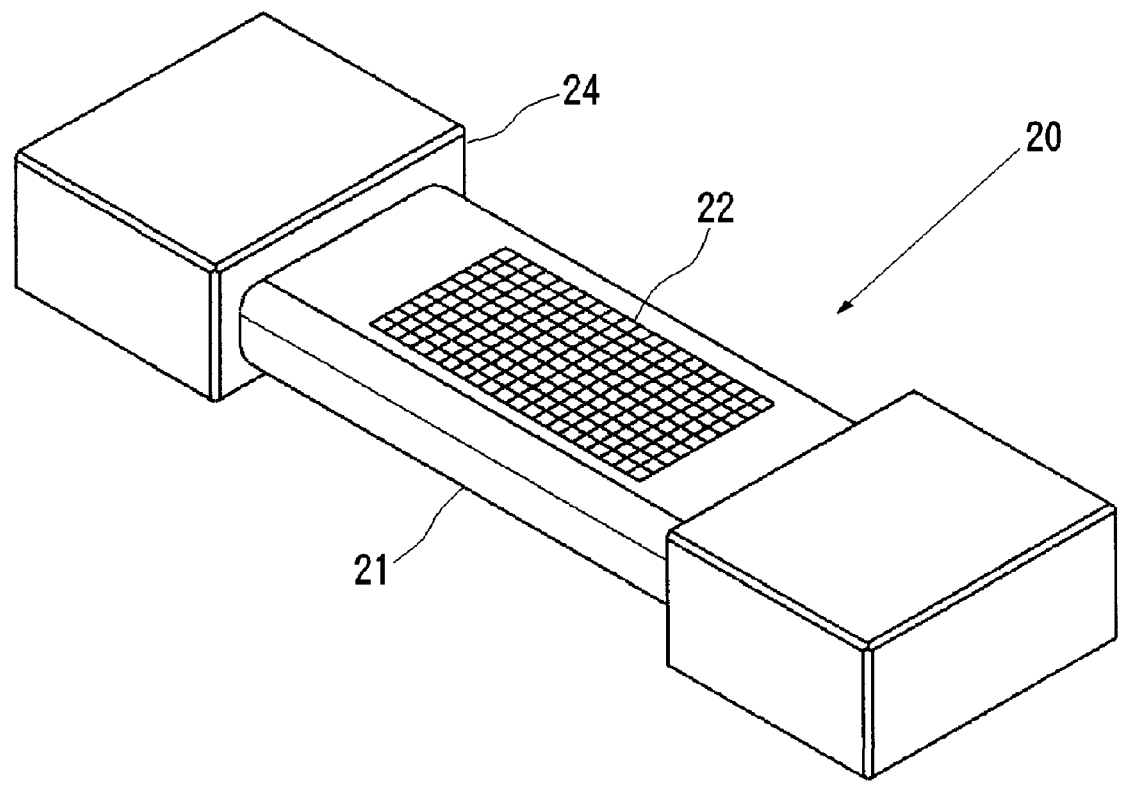
FIG. 4 is a perspective view of an excimer lamp in the photowashing apparatus illustrated in FIG. 2.
Figure 5:
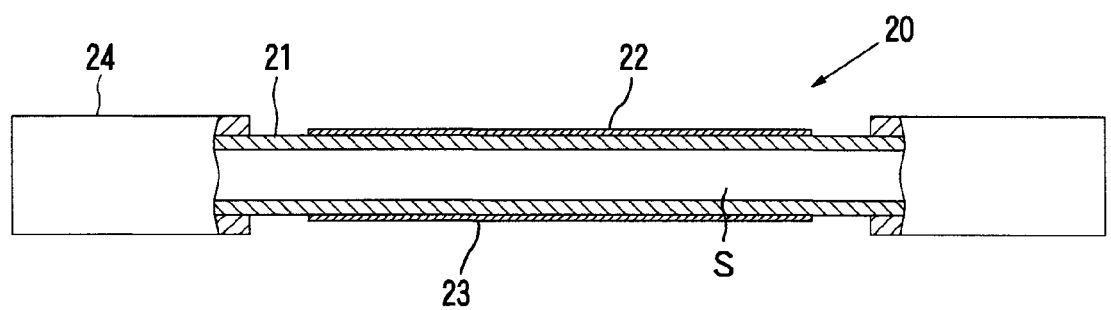
FIG. 5 is an explanatory cross-sectional view of the excimer lamp illustrated in FIG. 4.

FIG. 4 is a perspective view illustrating the excimer lamp 20, and FIG. 5 is an explanatory cross-sectional view of the excimer lamp 20 illustrated in FIG. 4. The excimer lamp includes a discharging container 21 having a flat plate-shape as a whole and formed with a discharging space S in the interior thereof and caps 24 are provided at both ends of the discharging container 21, and excimer light-emitting gas is sealed in the discharging space S of the discharging container 21 in an air-tight manner. A net-like high-voltage side electrode 22 is arranged on one surface of the discharging container 21, and a net-like earth-side electrode 23 is arranged on the other surface of the discharging container 21, and the high-voltage side electrode 22 and the earth-side electrode 23 are respectively connected to a high-frequency power source (not illustrated). Then, the excimer lamp 20 is arranged so that the one surface of the discharging container 21 where the high-voltage side electrode 22 is arranged faces the ultraviolet light transmitting window 11 of the housing 10.

Examples of materials which constitute the discharging container 21 may include those which allow favorable transmission of the vacuum ultraviolet light, specifically, silica glass such as synthetic quartz glass and sapphire glass.

Examples of materials which constitute the high-voltage side electrode 22 and the earth-side electrode 23 may include metallic materials such as aluminum, nickel, and gold. The high-voltage side electrode 22 and the earth-side electrode 23 may be formed by screen printing conductive past containing the above-described metallic material or by vacuum depositing the above-described metallic material.

Examples of the excimer light-emitting gas to be sealed in the discharging space S of the discharging container 21 may include those which can generate excimer that radiates vacuum ultraviolet light, specifically, noble gasses such as xenon, argon, or krypton, or mixed gas including the noble gas and halogen gas such as bromine, chlorine, iodine, or fluorine. Detailed examples of the excimer light-emitting gas include xenon gas that emits vacuum ultraviolet light having a wavelength of 172 nm, mixed gas including argon and iodine of 191 nm, and mixed gas including argon and fluorine of 193 nm.

Sealed pressures of the excimer gas fall within a range from 10 to 100 kPa, for example.

Figure 6A:
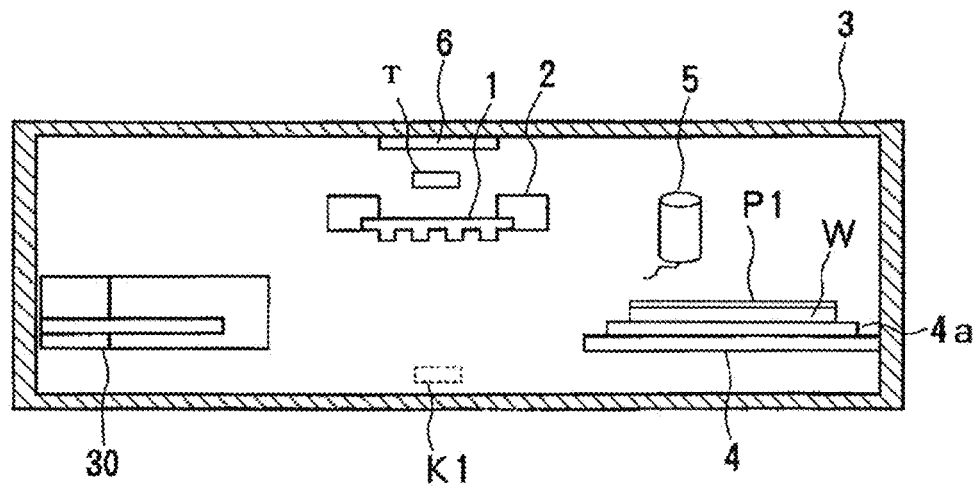
FIG. 6A is an explanatory drawing illustrating a process performed by the nanoimprint apparatus illustrated in FIG. 1 in a state in which an imprint material layer is formed on the surface of a substrate.
Figure 6B:
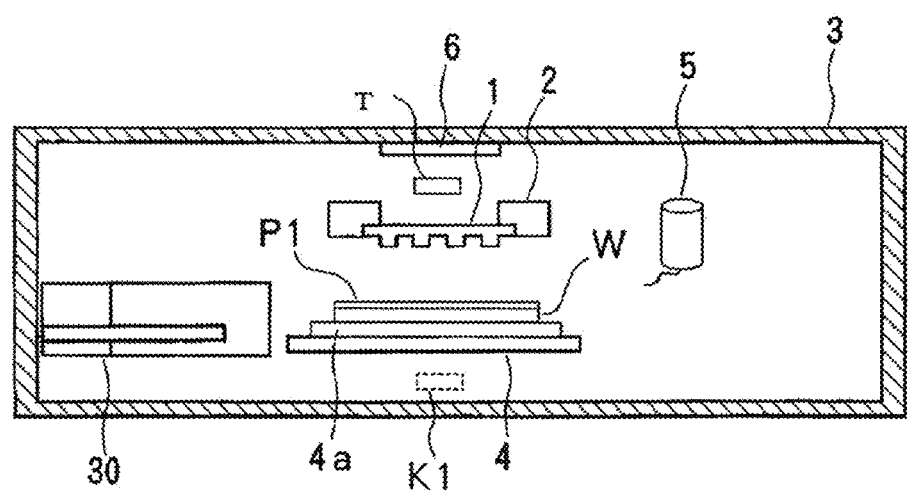
FIG. 6B is an explanatory drawing illustrating a state in which the substrate is conveyed to a position below the template.
Figure 7A:
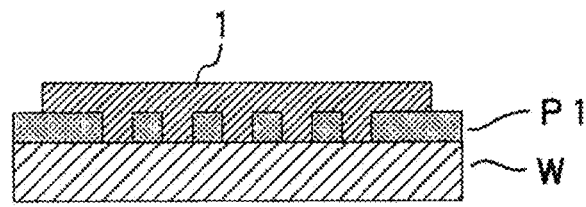
FIG. 7A is an explanatory drawing illustrating a pattern forming process of the nanoimprint apparatus illustrated in FIG. 1 in a state in which the template is pressed against the imprint material layer.
Figure 7B:
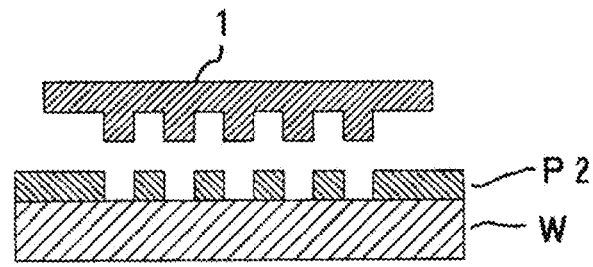
FIG. 7B is an explanatory drawing illustrating a state in which the template is separated from a hardened layer.

In such a nanoimprint apparatus, as illustrated in FIG. 6A, the substrate W held by the chuck 4a of the conveyance mechanism 4 is moved to a position below the application device 5 by the conveyance mechanism 4, and an imprint material formed of a liquid-state light-cured resist is applied to the surface of the substrate W by the application device 5, so that an imprint material layer P1 is formed on the substrate W. Subsequently, as illustrated in FIG. 6B, the substrate W formed with the imprint material layer P1 is moved to a position below the template 1 by the conveyance mechanism 4 and is aligned with a required position. Then, as illustrated in FIG. 7A, by moving the template 1 below the template 1 is brought into contact with and pressed against the imprint material layer P1 formed on the substrate W and, in this state, the imprint material layer P1 is irradiated with the ultraviolet light via the template 1, whereby the imprint material layer P1 is hardened by the hardening device 6. Then, as illustrated in FIG. 7B, the template 1 is separated from the hardened layer P2 obtained therefrom, whereby the pattern formation with respect to the substrate W is achieved.

When pattern formation with respect to the substrate W in this manner is terminated, photowashing of the template including a vacuum-ultraviolet light irradiation process is started.

Figure 6C:
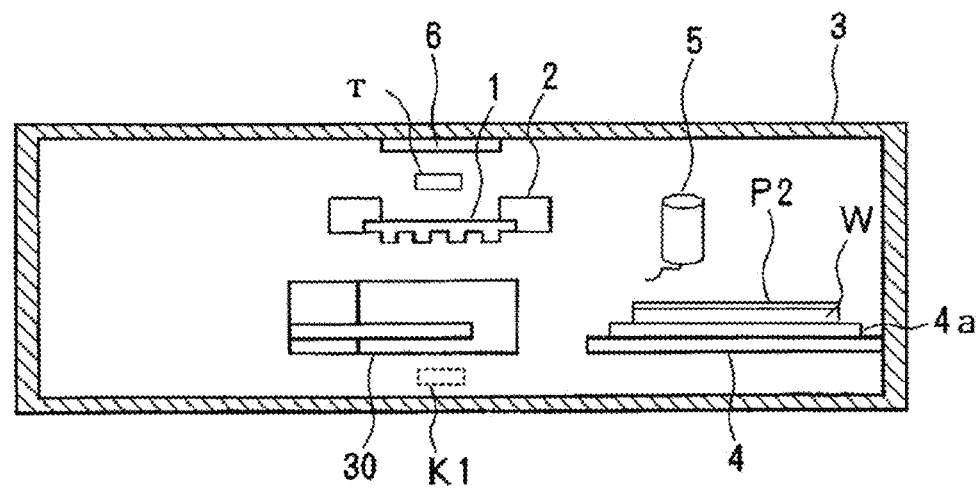
FIG. 6C is an explanatory drawing illustrating a state in which the photowashing apparatus is arranged so as to face a pattern surface of the template via a clearance therebetween.

Specifically, as illustrated in FIG. 6C, the substrate W is retracted by being moved from the position below the template 1 to the side position by the conveyance mechanism 4, and the photowashing apparatus 30 is conveyed to the position below the template 1 and the ultraviolet light transmitting window 11 (see FIG. 3) is arranged so as to face the pattern surface of the template 1 via a clearance and, in this state, the vacuum-ultraviolet light irradiation process is executed.

Here, a distance between an outside surface of the ultraviolet light transmitting window 11 and the pattern surface of the template 1 is, for example 0.3 to 10.0 mm.

In the vacuum-ultraviolet light irradiation process, the dry air supply mechanism connected to the dry air supply port K1 is activated, whereby dry air supplied from the dry air supply port K1 into the chamber 3 flows in the clearance between the ultraviolet light transmitting window of the photowashing apparatus 30 and the template 1 and, consequently, the pattern surface of the template 1 is exposed to an atmosphere of the dry air. Then, the excimer lamp 20 (see FIG. 4) in the photowashing apparatus 30 is illuminated in a state in which the dew point of the air in the chamber 3 measured by a dew-point measuring instrument (not illustrated) provided in the chamber 3 reaches a required value, so that the pattern surface of the template 1 is irradiated with vacuum ultraviolet light from the excimer lamp 20 via the ultraviolet light transmitting window 11, whereby photowashing of the template 1 is achieved.

Subsequently, the photowashing apparatus 30 is conveyed and is retracted from the position below the template 1, where the pattern formation with respect to a following substrate W is executed.

Examples of the dry air supply mechanism which can be used in the vacuum-ultraviolet light irradiation process described above include those including a filter configured to remove floating substances in the air, a compressor configured to compress air passed through the filter, an oil separator configured to remove oil contained in the compressed air fed from the compressor, and an air cooler configured to condense water content included in the compressed air by cooling the compressed air passed through the oil separator.

In the dry air supply mechanism as described above, the dew point of the dry air to be obtained can be adjusted by controlling the pressure of the compressed air compressed by the compressor and the cooling temperature of the compressed air cooled by the air cooler.

The dry air flowed in the clearance between the ultraviolet light transmitting window 11 and the template 1 preferably has dew points falling in a range from −110 to 10° C., and more preferably, in a range from −90 to −30° C. When the dew point of the dry air is lower than −110° C., the number of OH radical generated when water molecules are irradiated with the vacuum ultraviolet light is reduced, and hence the capability of removing foreign substances other than phosphorus and sulfur is lowered, and the foreign substances may easily be remained on the pattern surface of the template. In contrast, when the dew point of the dry air exceeds 10° C., since the water content in the dry air is excessive, sulfur compound or phosphorous compound such as sulfuric acid, phosphoric acid, and others may easily be generated by reaction of elemental sulfur or elemental phosphorus contained in the residual resist with water in the air.

The dry air used in the invention functions as UV-ozone washing processing gas, and may have dew points falling within a range from −110 to 10° C., and is not limited to those whose air dues points in the atmospheric air are adjusted as described above. The dry air used in the invention may be those whose dew points are adjusted by mixing nitrogen and oxygen, for example, and the concentration of oxygen may be any value as long as a desired amount of ozone is generated.

The flow rate of the dry air flowed in the clearance between the ultraviolet light transmitting window 11 and the template 1 falls within a range, for example, from 1 to 100 L/min.

The irradiation time of the vacuum ultraviolet light with respect to the template 1 falls within a range, for example, from 3 to 3600 seconds.

The vacuum-ultraviolet light irradiation process is preferably performed in a state in which the temperature of the pattern surface of the template 1 is controlled so as to fall within a range from 25 to 150° C. When the temperature of the pattern surface of the template 1 is lower than 25° C., the particles of the substance generated when the resist residual is degraded have large sizes and hence cannot be gasified easily. Therefore, there is a problem that the size of the particles needs to be reduced by further encouraging degradation by increasing the length of the irradiation time of the vacuum ultraviolet light and hence the washing efficiency is lowered. In contrast, when the temperature of the pattern surface of the template 1 exceeds 150° C., hardening of the resist residual staying on the template 1 progresses, and hence the resist residual can hardly be degraded. Consequently, the irradiation time for vacuum ultraviolet light needs to be elongated, so that there arises a problem that the washing efficiency is lowered.

As a method of controlling the temperature of the template 1, a method of controlling the temperature of the template 1 by a temperature control device arranged in contact with or in proximity to the template 1, or a method of controlling the temperature of the template 1 by controlling the temperature of dry air to temperatures from 25 to 150° C. by an appropriate gas temperature control device provided between the dry air supply port K1 and the dry air supply mechanism, and causing the dried air controlled in temperature to flow through the clearance between the ultraviolet light transmitting window 11 of the photowashing apparatus 30 and the template 1 may be used.

Figure 8A:
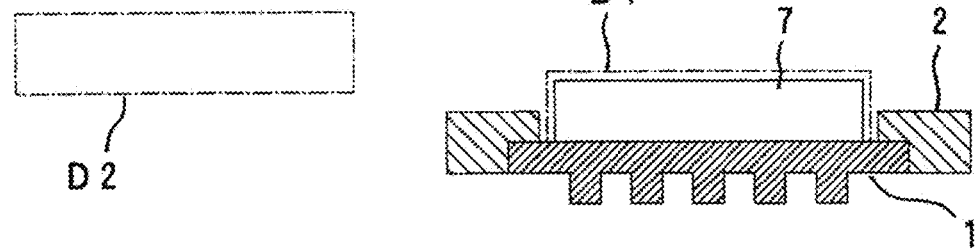
FIG. 8A is an explanatory drawing illustrating a position of temperature control execution and FIG. 8B is an explanatory drawing illustrating a retracting position of a temperature control device.
Figure 8B:
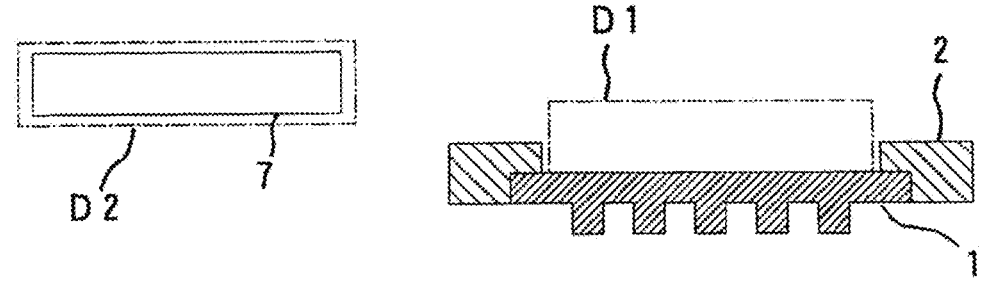

When controlling the temperature of the template 1 by the temperature control device arranged in contact with or in proximity to the template 1, the temperature control device is preferably provided so as to be movable between a position of temperature control execution D1 where a temperature control device 7 is in contact with or in proximity to the template 1 as illustrated in FIG. 8A and a retracting position D2 where the temperature control device 7 is retracted from the position of temperature control execution as illustrated in FIG. 8B. In this configuration, when performing a pattern formation with respect to the substrate W, the temperature control device 7 is in the state of being positioned at the retracting position D2, and when performing photowashing of the template 1, the temperature control device 7 is in the state of being positioned at the position of temperature control execution D1.

According to the above-described template washing method, even when the imprint material contains elemental sulfur or elemental phosphorus, generation of the sulfur compound such as sulfuring acid or phosphorous compound such as phosphoric acid is prevented or suppressed by irradiating the pattern surface of the template 1 with the vacuum ultraviolet light by the photowashing apparatus 30 under the atmosphere of the dry air, so that the resist residual remaining on the pattern surface of the template 1 may be reliably removed.

Also, according to the pattern forming method or the nanoimprint apparatus described above, a pattern having fewer defects may be reliably formed by pressing the template 1 washed by the above-described template washing method against the imprint material layer P1.

In FIG. 1, the dry air exit port T may be replaced by a dry air suction port provided with a mechanism configured to suck dry air.

Figure 9:
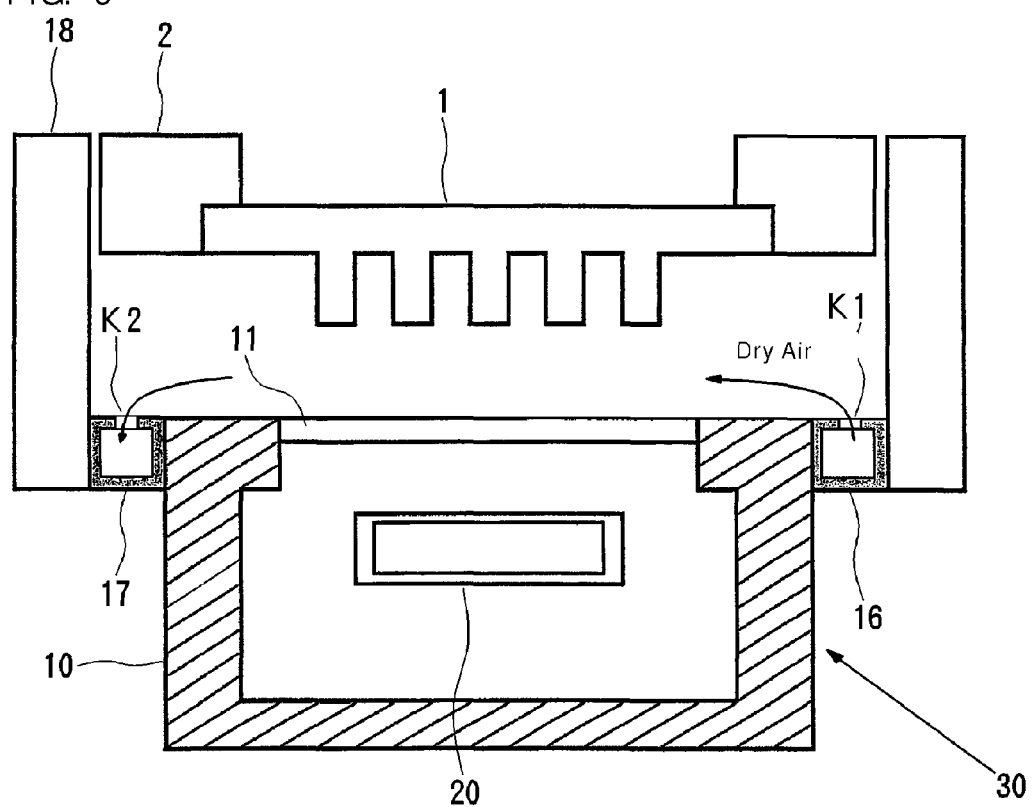
FIG. 9 is an explanatory cross-sectional view illustrating a configuration of an exemplified photowashing apparatus of the invention.

FIG. 9 is an explanatory cross-sectional view illustrating a configuration of the exemplified photowashing apparatus of the invention together with a template as an object to be processed. The photowashing apparatus 30 is used for photowashing the surface of the template in the nanoimprint apparatus, and the ultraviolet light transmitting window 11 is used by being arranged so as to face the pattern surface of the template 1 held by the holding member 2 via the clearance.

The housing 10 of the photowashing apparatus 30 is provided with one gas flow channel member 16 having a square cylindrical shape which is connected to the dry air supply mechanism (not illustrated) and allows dry air to flow therethrough so as to extend along an upper edge portion of the one surface side (the right side surface in the drawing), and is provided with other gas flow channel member 17 having a square cylindrical shape which is connected to a gas suction mechanism (not illustrated) and allows dry air to flow therethrough so as to extend along an upper edge portion of the other side surface (the left side surface in the drawing). The one gas flow channel member 16 is formed with the dry air supply port K1 in an upper surface thereof, whereby the dry air supply port K1 is positioned in the periphery of the ultraviolet light transmitting window 11 of the housing 10. The other gas flow channel member 17 is formed with a dry air suction port K2 on an upper surface thereof, whereby the dry air suction port K2 is positioned in the periphery of the ultraviolet light transmitting window 11 of the housing 10. The one gas flow channel member 16 and the other gas flow channel member 17 are provided with partitioning plates 18 which restrict the direction of flow of the dry air on respective side surfaces thereof. The partitioning plates 18 are provided so as to have clearances between the partitioning plates 18 and the holding member smaller than the clearance between the ultraviolet light transmitting window 11 and the template 1. Other configurations are the same as those of the photowashing apparatus illustrated in FIG. 3 and FIG. 4.

In the photowashing apparatus 30 described above, when the pattern formation on the substrate by the nanoimprint is terminated, the ultraviolet light transmitting window 11 of the photowashing apparatus 30 is arranged so as to face the pattern surface of the template 1 via the clearance and, in this state, the vacuum ultraviolet light irradiation process is executed.

In the vacuum-ultraviolet light irradiation process, the dry air supply mechanism connected to the dry air supply port K1 is activated and the gas suction mechanism connected to the dry air suction port K2 is simultaneously activated, whereby dry air supplied from the dry air supply port K1 flows in the clearance between the ultraviolet light transmitting window 11 of the photowashing apparatus 30 and the template 1 and, consequently, the pattern surface of the template 1 is exposed to the atmosphere of the dry air. Then, in this state, the excimer lamp 20 of the photowashing apparatus 30 is illuminated, so that the pattern surface of the template 1 is irradiated with vacuum ultraviolet light from the excimer lamp 20 via the ultraviolet light transmitting window 11, whereby photowashing of the template 1 is achieved.

Subsequently, the photowashing apparatus 30 is conveyed and is retracted from the position below the template 1, where the pattern formation with respect to a following substrate is executed.

Detailed conditions in the vacuum-ultraviolet light irradiation process by the photowashing apparatus described above are the same as those in the vacuum-ultraviolet light irradiation process performed by the above-described nanoimprint apparatus.

According to the photowashing apparatus 30 described above, even when the imprint material contains elemental sulfur or phosphorus elemental, generation of sulfur compound such as sulfuric acid or phosphorous compound such as phosphoric acid is prevented or suppressed because the pattern surface of the template 1 is irradiated with the vacuum ultraviolet light by the photowashing apparatus 30 under the atmosphere of the dry air by allowing the dry air supplied from the dry air supply port K1 to flow through the clearance between the ultraviolet light transmitting window 11 of the photowashing apparatus 30 and the template 1, so that the resist residual remaining on the pattern surface of the template 1 may be reliably removed.

Since the dry air suction port K2 is provided in the periphery of the ultraviolet light transmitting window, the dew point of the dry air in the periphery of the template 1 may be prevented from rising, that is, the amount of water content included in the dry air for the template 1 may be prevented from increasing even when the water content included in the imprint material layer is evaporated by sucking the dry air flowing through the clearance between the ultraviolet light transmitting window 11 and the template 1 through the dry air suction port K2.

In addition, the flow of the dry air in the clearance between the ultraviolet light transmitting window 11 of the photowashing apparatus 30 and the template 1 is ensured by providing the partitioning plates 18 on the respective side surfaces of the one gas flow channel member 16 and the other gas flow channel member 17 so that the clearance between the partitioning plate 18 and the holding member is smaller than the clearance between the ultraviolet light transmitting window 11 and the template 1.

Then, the template 1 washed by the photowashing apparatus 30 in such a manner is pressed against the imprint material layer, whereby a pattern with fewer defects may reliably be formed.

Although the embodiment of the invention has been described thus far, the invention is not limited to the embodiment, and various modifications may be made.

For example, a low-pressure mercury lamp may be used as the vacuum ultraviolet light emitting lamp instead of the excimer lamp in the photowashing apparatus.

In the photowashing apparatus illustrated in FIG. 9, an adequate gas temperature control device may be provided between the one gas flow channel member 16 and the dry air supply mechanism. In this configuration, the temperature of the template 1 may be controlled by controlling the temperature of the dry air to fall within a range from 25 to 150° C. by the gas temperature control device and allowing the dry air controlled in temperature to flow through the clearance between the ultraviolet light transmitting window of the photowashing apparatus 30 and the template 1.

The nanoimprint method and the nanoimprint apparatus may be applied to nanoimprint using an imprint material formed of a thermoset-type resist. In this case, silicon carbide (SiC) may be used as a material which constitutes the template, and the one having a heater lamp may be used as a hardening device for the imprint material layer.

EXAMPLES

Example 1

According to the configuration illustrated in FIG. 2 to FIG. 4, a photowashing apparatus having specifications as described below was manufactured.

Housing

Dimensions of the lamp storage chamber were 250 mm×100 mm×80 mm, and the ultraviolet light transmitting window was formed of synthetic quartz glass, and had a width and a length of 60 mm×60 mm and a thickness of 5 mm.

Excimer Lamp

The discharging container was formed of synthetic quartz glass, was filled with xenon gas sealed therein, and had a light-emitting length of 50 mm, a light-emitting width of 40 mm, and an input of 15 W.

The excimer lamp was arranged in the housing so that one surface of the discharging container on which a high-voltage side electrode was arranged faced the ultraviolet light transmitting window, and the degree of diffusion of irradiation of the vacuum ultraviolet light on the surface of the ultraviolet light transmitting window was 80 mW/cm$^2$.

A template formed of quartz glass having a pattern area in which a stripe pattern with depressions and projections having a width of 20 nm respectively and a projection height of 70 nm were formed on the pattern surface having dimensions of 10 mm×10 mm, and having a thickness of 6 mm was manufactured.

By using the above-described template, a pattern was formed by nanoimprint as described below.

An imprint material layer having a thickness of 70 nm was formed on a substrate by applying an imprint material formed of liquid state light-cured resist containing a substance including elemental sulfur and elemental phosphorus, pressing the above-described template against the imprint material layer, hardening the imprint material layer in this state, and then separating the template from the obtained hardened layer. This pattern forming operation was performed twelve times in total by using the same template.

Then, the above-described photowashing apparatus was arranged so that the ultraviolet light transmitting window faced the pattern surface of the template with a clearance of 3 mm therebetween, and dry air having a dew point of 10° C. was flowed through the clearance between the ultraviolet light transmitting window of the photowashing apparatus and the template at a flow rate of 50 L/min. so as to form the atmosphere of the dry air in the periphery of the template. In this state, the template was washed by turning the excimer lamp of the photowashing apparatus ON, and irradiating the template with vacuum ultraviolet light for 1200 seconds. In such washing, the temperature of the pattern surface of the template was 30° C. Then, the above-described pattern forming operation was performed by using the washed template, obtained hardened layer was observed by using the scanning-type electronic microscope, and the number of pattern defects (cracking of projections of the pattern) per unit surface area (25 $\mu m^2$) (hereinafter, referred to as number of pattern defects) was measured. The result is shown in Table 1.

Example 2

The twelve times of pattern forming operation using the above-described template, washing of the template, and the pattern forming operation using the washed template were performed in the same manner as Example 1 except that dry air having a dew point of −20° C. was used instead of the dry air having a dew point of 10° C., obtained hardened layer was observed by using a scanning-type electronic microscope, and the number of pattern defects per unit surface area (25 $\mu m^2$) was measured. The result is shown in Table 1.

Example 3

The twelve times of pattern forming operation using the above-described template, washing of the template, and the pattern forming operation using the washed template were performed in the same manner as Example 1 except that dry air having a dew point of −30° C. was used instead of the dry air having a dew point of 10° C., obtained hardened layer was observed by using the scanning-type electronic microscope, and the number of pattern defects per unit surface area (25 $\mu m^2$) was measured. The result is shown in Table 1.

Example 4

The twelve times of pattern forming operation using the above-described template, washing of the template, and the pattern forming operation using the washed template were performed in the same manner as Example 1 except that dry air having a dew point of −50° C. was used instead of the dry air having a dew point of 10° C., obtained hardened layer was observed by using the scanning-type electronic microscope, and the number of pattern defects per unit surface area (25 $\mu m^2$) was measured. The result is shown in Table 1.

Example 5

The twelve times of pattern forming operation using the above-described template, washing of the template, and the pattern forming operation using the washed template were performed in the same manner as Example 1 except that dry air having a dew point of −80° C. was used instead of the dry air having a dew point of 10° C., obtained hardened layer was observed by using the scanning-type electronic microscope, and the number of pattern defects per unit surface area (25 $\mu m^2$) was measured. The result is shown in Table 1.

Example 6

The twelve times of pattern forming operation using the above-described template, washing of the template, and the pattern forming operation using the washed template were performed in the same manner as Example 1 except that dry air having a dew point of −90° C. was used instead of the dry air having a dew point of 10° C., obtained hardened layer was observed by using the scanning-type electronic microscope, and the number of pattern defects per unit surface area (25 $\mu m^2$) was measured. The result is shown in Table 1.

Example 7

The twelve times of pattern forming operation using the above-described template, washing of the template, and the pattern forming operation using the washed template were performed in the same manner as Example 1 except that dry air having a dew point of −110° C. was used instead of the dry air having a dew point of 10° C., obtained hardened layer was observed by using the scanning-type electronic microscope, and the number of pattern defects per unit surface area (25 $\mu m^2$) was measured. The result is shown in Table 1.

Comparative Example 1

The twelve times of pattern forming operation using the above-described template, washing of the template, and the pattern forming operation using the washed template were performed in the same manner as Example 1 except that the template was washed under the atmosphere without allowing the dry air to flow through the clearance between the ultraviolet light transmitting window and the template, obtained hardened layer was observed by using the scanning-type electronic microscope, and the number of pattern defects per unit surface area (25 $\mu m^2$) was measured. Here, the dew point of the atmosphere was 15° C. The result is shown in Table 1.

Reference Example 1

The twelve times of pattern forming operation using the above-described template, washing of the template, and the pattern forming operation using the washed template were performed in the same manner as Example 1 except that dry air having a dew point of −130° C. was used instead of the dry air having a dew point of 10° C., obtained hardened layer was observed by using the scanning-type electronic microscope, and the number of pattern defects per unit surface area (25 $\mu m^2$) was measured. The result is shown in Table 1.

TABLE 1

| | Dew point of dry air (° C.) | Temperature of pattern surface (° C.) | Number of pattern defects (points/25 $\mu m^2$) |
|---|---|---|---|
| Example 1 | 10 | 30 | 5 |
| Example 2 | −20 | 30 | 2 |
| Example 3 | −30 | 30 | 0 |
| Example 4 | −50 | 30 | 0 |
| Example 5 | −80 | 30 | 0 |
| Example 6 | −90 | 30 | 0 |
| Example 7 | −110 | 30 | 3 |
| Comparative Example 1 | 15 (atmosphere) | 30 | 9 |
| Reference Example 1 | −130 | 30 | 9 |

As is clear from the results in Table 1, in Examples 1 to 7, since the resist residual staying on the template was sufficiently removed by washing, it is understood that the pattern having fewer pattern defects was formed. In addition, by adjusting the dew point of the dry air to be −30 to −90° C., the number of pattern defects may be set to 0/25 μm².

Reference Example 2

The twelve times of pattern forming operation using the above-described template, washing of the template, and one time of the pattern forming operation using the washed template were performed in the same manner as Example 3 except that the temperature of the pattern surface of the template is controlled to be 20° C. by the temperature control device in washing of the template, obtained hardened layer was observed by using the scanning-type electronic microscope, and the number of pattern defects per unit surface area (25 μm²) was measured. The result is shown in Table 2.

Example 8

The twelve times of pattern forming operation using the above-described template, washing of the template, and one time of the pattern forming operation using the washed template were performed in the same manner as Example 3 except that the temperature of the pattern surface of the template is controlled to be 25° C. by the temperature control device in washing of the template, obtained hardened layer was observed by using the scanning-type electronic microscope, and the number of pattern defects per unit surface area (25 μm²) was measured. The result is shown in Table 2.

Example 9

The twelve times of pattern forming operation using the above-described template, washing of the template, and one time of the pattern forming operation using the washed template were performed in the same manner as Example 3 except that the temperature of the pattern surface of the template is controlled to be 50° C. by the temperature control device in washing of the template, obtained hardened layer was observed by using the scanning-type electronic microscope, and the number of pattern defects per unit surface area (25 μm²) was measured. The result is shown in Table 2.

Example 10

The twelve times of pattern forming operation using the above-described template, washing of the template, and one time of the pattern forming operation using the washed template were performed in the same manner as Example 3 except that the temperature of the pattern surface of the template is controlled to be 75° C. by the temperature control device in washing of the template, obtained hardened layer was observed by using the scanning-type electronic microscope, and the number of pattern defects per unit surface area (25 μm²) was measured. The result is shown in Table 2.

Example 11

The twelve times of pattern forming operation using the above-described template, washing of the template, and one time of the pattern forming operation using the washed template were performed in the same manner as Example 3 except that the temperature of the pattern surface of the template is controlled to be 100° C. by the temperature control device in washing of the template, obtained hardened layer was observed by using the scanning-type electronic microscope, and the number of pattern defects per unit surface area (25 μm²) was measured. The result is shown in Table 2.

Example 12

The twelve times of pattern forming operation using the above-described template, washing of the template, and one time of the pattern forming operation using the washed template were performed in the same manner as Example 3 except that the temperature of the pattern surface of the template is controlled to be 150° C. by the temperature control device in washing of the template, obtained hardened layer was observed by using the scanning-type electronic microscope, and the number of pattern defects per unit surface area (25 μm²) was measured. The result is shown in Table 2.

Reference Example 3

The twelve times of pattern forming operation using the above-described template, washing of the template, and one time of the pattern forming operation using the washed template were performed in the same manner as Example 3 except that the temperature of the pattern surface of the template is controlled to be 200° C. by the temperature control device in washing of the template, obtained hardened layer was observed by using the scanning-type electronic microscope, and the number of pattern defects per unit surface area (25 μm²) was measured. The result is shown in Table 2.

Reference Example 4

The twelve times of pattern forming operation using the above-described template, washing of the template, and one time of the pattern forming operation using the washed template were performed in the same manner as Example 3 except that the temperature of the pattern surface of the template is controlled to be 250° C. by the temperature control device in washing of the template, obtained hardened layer was observed by using the scanning-type electronic microscope, and the number of pattern defects per unit surface area (25 μm²) was measured. The result is shown in Table 2.

Reference Example 5

The twelve times of pattern forming operation using the above-described template, washing of the template, and one time of the pattern forming operation using the washed template were performed in the same manner as Example 1 except that the temperature of the pattern surface of the template is controlled to be 10° C. by the temperature control device in washing of the template, obtained hardened layer was observed by using the scanning-type electronic microscope, and the number of pattern defects per unit surface area (25 μm²) was measured. The result is shown in Table 2.

TABLE 2

|  | Dew point of dry air (° C.) | Temperature of pattern surface (° C.) | Number of pattern defects (points/25 μm²) |
|---|---|---|---|
| Reference Example 2 | −30 | 20 | 9 |
| Example 8 | −30 | 25 | 2 |
| Example 3 | −30 | 30 | 0 |
| Example 9 | −30 | 50 | 0 |

TABLE 2-continued

|  | Dew point of dry air (° C.) | Temperature of pattern surface (° C.) | Number of pattern defects (points/25 μm²) |
| --- | --- | --- | --- |
| Example 10 | −30 | 75 | 0 |
| Example 11 | −30 | 100 | 0 |
| Example 12 | −30 | 150 | 0 |
| Reference Example 3 | −30 | 200 | 85 |
| Reference Example 4 | −30 | 250 | 9300 |
| Reference Example 5 | 10 | 10 | 600000 |

In Table 2, Example 3 shown in Table 1 is inserted. As is clear from the result in Table 2, since the resist residual staying on the template was efficiently removed by controlling the temperature of the pattern surface of the template to be 25 to 150° C. in washing of the template when the dew point of the dry air is −30° C., it is understood that the pattern having fewer pattern defects was formed. Furthermore, by heating the pattern surface to be 30 to 150° C. by a heating device, the number of pattern defects may become 0/25 μm².

In Reference Example 5, it is estimated that the number of pattern defects was increased abruptly because of generation of dew drops generated by a low temperature of the pattern surface of the template in comparison with Example 1.

Results of experiments performed with the dry air having dew points falling within a range from 10 to −110° C. for the dry air at a dew point of −30° C. as in Table 2 (except for Reference Example 5) were also the same. In other words, although the number of pattern defects was suppressed up to a template temperature of 150° C., the number of pattern defects was increased abruptly at temperatures of 200° C. and 250° C.

This application is based on Japanese Patent application No. 2012-126683 filed in Japan Patent Office on Jun. 4, 2012, the contents of which are hereby incorporated by reference.

Although the present invention has been fully described byway of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A template washing method for photowashing a pattern surface of a template used in nanoimprint comprising
a vacuum-ultraviolet light irradiation process for irradiating vacuum-ultraviolet light onto the pattern surface of the template under the state that the pattern surface of the template is exposed to an atmosphere of dry air.

2. The template washing method according to claim 1, wherein a dew point of the dry air falls within a range from −110 to 10° C.

3. The template washing method according to claim 1, wherein the vacuum-ultraviolet light irradiation process is performed in a state in which a temperature of the pattern surface of the template is controlled to fall within a range from 25 to 150° C.

4. The template washing method according to claim 2, wherein the vacuum-ultraviolet light irradiation process is performed in a state in which a temperature of the pattern surface of the template is controlled to fall within a range from 25 to 150° C.

5. The template washing method according to claim 3, wherein the temperature of the template is controlled by a temperature control device arranged in contact with or in proximity to the template.

6. The template washing method according to claim 4, wherein the temperature of the template is controlled by a temperature control device arranged in contact with or in proximity to the template.

7. The template washing method according to claim 3, wherein the temperature of the template is controlled by setting the temperature of the dry air to fall within the range from 25 to 150° C.

8. The template washing method according to claim 4, wherein the temperature of the template is controlled by setting the temperature of the dry air to fall within the range from 25 to 150° C.

* * * * *